US011114704B2

(12) United States Patent
Fripp et al.

(10) Patent No.: US 11,114,704 B2
(45) Date of Patent: Sep. 7, 2021

(54) DEPASSIVATION OF COMPLETION TOOL BATTERIES

(71) Applicant: Halliburton Energy Services, Inc., Houston, TX (US)

(72) Inventors: Michael Linley Fripp, Carrollton, TX (US); Zachary William Walton, Carrollton, TX (US); Matthew James Merron, Carrollton, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 7 days.

(21) Appl. No.: 16/312,839

(22) PCT Filed: Aug. 9, 2016

(86) PCT No.: PCT/US2016/046182
§ 371 (c)(1),
(2) Date: Dec. 21, 2018

(87) PCT Pub. No.: WO2018/030998
PCT Pub. Date: Feb. 15, 2018

(65) Prior Publication Data
US 2019/0323305 A1    Oct. 24, 2019

(51) Int. Cl.
*H01M 10/44*     (2006.01)
*E21B 7/02*      (2006.01)
(Continued)

(52) U.S. Cl.
CPC .............. *H01M 10/44* (2013.01); *E21B 7/02* (2013.01); *E21B 21/08* (2013.01);
(Continued)

(58) Field of Classification Search
CPC ..... H01M 10/44; H02J 7/00712; E21B 21/08; G01R 31/3648
(Continued)

(56) References Cited

U.S. PATENT DOCUMENTS

| 4,839,248 A | 6/1989 | Magnussen, Jr. et al. |
| 6,815,930 B2 | 11/2004 | Goodman |

(Continued)

FOREIGN PATENT DOCUMENTS

| WO | 2014/145259 A2 | 9/2014 |
| WO | 2016/085465 A1 | 6/2016 |

OTHER PUBLICATIONS

International Search Report and Written Opinion issued in related PCT Application No. PCT/US2016/046182 dated May 1, 2017, 13 pages.

(Continued)

*Primary Examiner* — Edward Tso
*Assistant Examiner* — Aaron Piggush
(74) *Attorney, Agent, or Firm* — Scott Richardson; Baker Botts L.L.P.

(57) ABSTRACT

Methods and systems for depassivating completion tool batteries are provided. In one embodiment, the methods comprise: providing a completion tool disposed within a wellbore penetrating at least a portion of a subterranean formation, wherein the completion tool is electrically coupled to an at least partially passivated lithium battery; depassivating the at least partially passivated lithium battery in the wellbore by discharging the lithium battery; and powering the completion tool with the at least partially depassivated lithium battery.

19 Claims, 4 Drawing Sheets

(51) Int. Cl.
    *E21B 21/08* (2006.01)
    *G01R 31/36* (2020.01)
    *H01M 10/052* (2010.01)
    *H01M 10/48* (2006.01)

(52) U.S. Cl.
    CPC ...... *G01R 31/3648* (2013.01); *H01M 10/052* (2013.01); *H01M 10/48* (2013.01); *H01M 2220/10* (2013.01)

(58) Field of Classification Search
    USPC .................... 320/128, 136, 158; 361/103
    See application file for complete search history.

(56) References Cited

U.S. PATENT DOCUMENTS

| | | | |
|---|---|---|---|
| 7,258,169 | B2 | 8/2007 | Fripp et al. |
| 9,013,144 | B2 | 4/2015 | Cooley et al. |
| 10,808,523 | B2* | 10/2020 | Fripp ...................... E21B 33/10 |
| 2004/0189249 | A1* | 9/2004 | Beals ........................ H02J 7/34 320/116 |
| 2005/0211436 | A1 | 9/2005 | Fripp et al. |
| 2006/0126249 | A1* | 6/2006 | Boling .................. H02J 7/0031 361/103 |
| 2007/0003831 | A1 | 1/2007 | Fripp et al. |
| 2009/0301723 | A1 | 12/2009 | Gray |
| 2012/0268074 | A1* | 10/2012 | Cooley .................. H01G 11/08 320/130 |
| 2013/0106615 | A1 | 5/2013 | Prammer |

OTHER PUBLICATIONS

Preliminary Search Report issued in French Patent Application No. FR1756104 dated Dec. 2, 2019, 6 pages.
Written Opinion issued in related Singapore Patent Application No. 11201811069P dated Oct. 12, 2020, 5 pages.
Third Technical Examination Report issues in related Danish Patent Application No. PA 2018 01064 dated Dec. 9, 2020, 2 pages.

* cited by examiner

DEPASSIVATION OF COMPLETION TOOL BATTERIES

CROSS-REFERENCE TO RELATED APPLICATION

The present application is a U.S. National Stage Application of International Application No. PCT/US2016/046182 filed Aug. 9, 2016, which is incorporated herein by reference in its entirety for all purposes.

BACKGROUND

Hydrocarbons, such as oil and gas, are commonly obtained from subterranean formations that may be located onshore or offshore. The development of subterranean operations and the processes involved in removing hydrocarbons from a subterranean formation typically involve a number of different steps such as, for example, drilling a wellbore at a desired well site, treating the wellbore to optimize production of hydrocarbons, and performing the necessary steps to produce and process the hydrocarbons from the subterranean formation.

Completion is the general process of bringing a well into production after drilling into a subterranean formation having a hydrocarbon reservoir. A single well may be completed multiple times, creating multiple "zones" for fluids to communicate between the reservoir and the wellbore. When completing a given zone, the zone may need to be isolated from other zones. For example, when a zone is to be hydraulically fractured, the zone may need to be isolated from uncompleted zones to prevent their premature fracturing and from previously completed zones to prevent fluid losses into the formation.

Zones are generally isolated by downhole completion tools. Completion tools may include packers for sealing zones, sliding sleeves operable to permit flow to and from specific zones, control valves for controlling and directing flow, and various other tools for performing other functions. To permit individual zones to be selectively isolated, the completion tools may be operable between different positions or modes of operation.

Some completion tools are operated in part by onboard electronics that receive control signals from operators at the surface or from downhole sensor readings and require onboard power storage to operate. Downhole completion tools often use a lithium battery as their power storage. However, lithium battery performance in a wellbore is limited by the bottom hole temperatures and the time duration in the wellbore. Lithium batteries used with downhole completion tools may experience passivation due in part to these high temperatures and long durations downhole, which limits the ability of the batteries to deliver electrical power to the downhole completion tool. The longer a lithium battery is stored at elevated temperatures and the longer the period of time between the application of electrical loads to a lithium battery, the greater the passivation. Thus, passivation may give rise to temperature and time duration restrictions on the use of lithium batteries to power completion tools.

In some cases, lithium battery-powered tools are depassivated on the surface prior to use downhole. For example, batteries are connected to a depassivation box on the surface shortly before placement in the wellbore. However, batteries powering completion tools operate downhole for long durations, even permanently, and often can not be returned to the surface for depassivation.

BRIEF DESCRIPTION OF THE DRAWINGS

These drawings illustrate certain aspects of some of the embodiments of the present disclosure, and should not be used to limit or define the claims.

Figure 1:
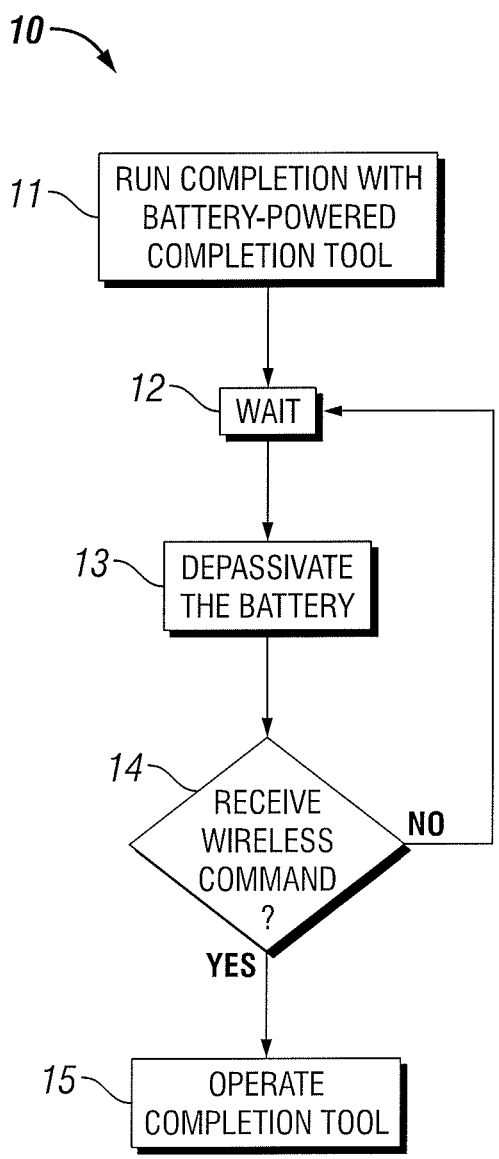
FIG. 1 is a process flow diagram for periodically depassivating a completion tool battery in accordance with certain embodiments of the present disclosure.

While embodiments of this disclosure have been depicted, such embodiments do not imply a limitation on the disclosure, and no such limitation should be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DESCRIPTION OF CERTAIN EMBODIMENTS

Illustrative embodiments of the present disclosure are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

The present disclosure relates to methods and systems for depassivating batteries used to power completion tools. Particularly, the present disclosure relates to methods and systems for depassivating batteries used to power completion tools by drawing current from the completion tool battery.

In certain embodiments, the present disclosure relates to a method comprising: providing a completion tool disposed within a wellbore penetrating at least a portion of a subterranean formation, wherein the completion tool is electrically coupled to an at least partially passivated lithium battery; depassivating the at least partially passivated lithium battery in the wellbore by discharging the lithium battery; and powering the completion tool with the at least partially depassivated lithium battery.

In certain embodiments, the present disclosure relates to a system comprising: a production string disposed in a wellbore penetrating at least a portion of a subterranean formation; and a completion tool coupled to the production string, wherein the completion tool comprises a lithium battery and a controller configured to depassivate the lithium battery by drawing current from the lithium battery. In some embodiments, the present disclosure relates to a system comprising: a production string disposed in a wellbore penetrating at least a portion of a subterranean formation; and a plurality of completion tools coupled to the production string, wherein each of the plurality of completion tools comprises a lithium battery and a controller configured to depassivate the battery by drawing current from the lithium.

Among the many potential advantages to the methods and systems of the present disclosure, only some of which are alluded to herein, the methods and systems of the present disclosure provide for depassivation of completion tool batteries, allowing for the use of lithium completion tool batteries for longer periods of time and in higher temperature applications. Unlike other battery-powered downhole tools such as slickline, wireline, logging-while-drilling ("LWD"), or measurement-while-drilling ("MWD") tools, completion tools are often unable to be returned to the surface for maintenance and/or depassivation. Completion tools stay in the wellbore for extended periods of time without the capacity to recharge. Accordingly, battery power for self-powered completion tools may be used sparingly. Nonetheless, in certain embodiments, using some of the battery power to depassivate the completion tool battery downhole results in improved battery performance and longer useful life, providing larger operation windows for completion tools to be installed and functioned.

Chemical passivation is a process where an inert (or "passive") high-resistance film is formed over the surface of a material. In lithium batteries, passivation may occur when an inert film is formed over the lithium anode. Without being bound by theory, it is believed that this film is the product of a chemical reaction between the lithium anode and the electrolyte that takes place when the battery is not being discharged. It is believed that salt crystals build up on the lithium surface of the anode which may increase the internal resistance of the battery and reduce its response characteristics. As a result, passivated or partially passivated lithium batteries may be subject to voltage delays often as long as several seconds to several minutes. Voltage delay is the time required for a battery to reach an acceptable voltage or power delivery condition after the application of a load. In some embodiments, a partially passivated battery may experience minor voltage delay, where the voltage drops below normal operating values initially, but recovers with continued discharge. In certain embodiments, a severely passivated battery will exhibit deeper voltage drops with longer recovery times, or even be unable to recover to normal operating voltage. In certain embodiments, voltage drops may cause a battery to delay or prevent the operation of a completion tool.

As used herein, "lithium battery" refers to a battery comprising lithium metal or lithium compounds as an anode. In certain embodiments, the anode of a lithium battery may be a lithium alloy (e.g., aluminum-lithium). In certain embodiments, the cathode of a lithium battery may be a liquid at its intended operating temperature, such as thionyl chloride or sulfuryl chloride. In some embodiments, the cathode can also be a solid, including, but not limited to graphite, carbon, silicon, iodine, copper, manganese, cobalt, oxides of any of the foregoing, or any combination thereof. A lithium battery may be referred to as a lithium-ion battery where the lithium ions intercollate in the electrode such as lithium-iron-phosphate, lithium-cobalt, or lithium-manganese. A lithium battery may be a primary (non-rechargeable) battery or a secondary (rechargeable) battery. A lithium battery may include one or more cells. In some embodiments, a lithium battery may comprise a lithium thionyl chloride cell. In some embodiments, a lithium battery may comprise a lithium secondary cell.

Passivation in lithium batteries is time and temperature sensitive. The longer a lithium battery is stored at elevated temperatures and the longer the period of time between the application of electrical loads to a lithium battery, the greater the passivation and the greater the voltage delay. In certain embodiments, batteries used with completion tools are subject to high bottom hole temperatures, extended durations in the wellbore, and long durations between load applications. In some embodiments, completion tools may experience downhole temperatures from 100° F. to 350° F., or in some cases 400° F. or higher. In certain embodiments, completion tools may remain downhole for days, weeks, years, or even permanently. In certain embodiments, time between uses of the completion tool batteries may also be significant, increasing the risk of passivation. In some embodiments, for example, a completion tool battery may not be used until 2 days, 3 weeks, or 4 months after installation, and days, weeks, months, or years may pass between operations of the completion tool.

In some embodiments, using a portion of battery power to depassivate completion tool batteries may increase the useful life of a battery. Depassivation may be accomplished by using battery power to aid in the removal of the passivation layer. In some embodiments, for example, depassivation may comprise drawing a load current from a battery for a short period of time. In certain embodiments, the load current is not drawn to power the completion tool, but rather is drawn to a control circuit, including, but not limited to a circuit comprising a resistor, a varistor, a diode, and any combination thereof. The control circuit may be coupled to the battery within the completion tool. The discharging of the completion tool battery during depassivation may occur for any suitable period of time, including but not limited to 1 millisecond ("ms"), 5 ms, 10 ms, 100 ms, 1 second, 5 seconds, 20 seconds, 100 seconds, 5 minute, 30 minutes, and 1 hour. In some embodiments, the depassivation of the battery could last several days. In certain embodiments, the battery is discharged until battery performance improved. In some embodiments, for example, battery resistance may be measured while depassivation occurs and depassivation may stop when battery resistance drops below a satisfactory level, indicating that the battery has been sufficiently depassivated. In some embodiments, for example, the battery voltage may be measured while depassivation occurs and depassivation may stop when the battery voltage recovers above a satisfactory level, indicating that the battery has been sufficiently depassivated.

In certain embodiments, the current drawn from the battery during depassivation may be constant, pulsed, ramped up, ramped down, alternated or otherwise varied during depassivation. In certain embodiments, the current drawn from the battery may include, without limitation, 1 mA, 2 mA, 5 mA, 10 mA, 100 mA, 150 mA, 200 mA, 500 mA, 1 A, 2 A, 5 A, and 10 A per cell. In certain embodiments, the current drawn from the battery may include, without limitation, 0.1 C, 0.5 C, 1 C, and 3 C where C is a measure of the rate at which a battery is discharged relative to its maximum capacity. In certain embodiments, for example, a battery may be loaded at 4 milliamps (mA) per cell for three days and then 150 mA per cell for thirty minutes. In certain embodiments, the depassivation load may vary with the state of charge of the battery. When the battery is near full charge, a load of 150 mA per cell for 1 minute every day may depassivate the cell. As the battery nears end of life, a lower load of 100 mA per cell for 1 minute every day may be sufficient to depassivate a cell. In some embodiments, the current drawn during passivation may be "wasted," for example not used to power a completion tool. In certain embodiments, for example, the discharging of the battery during passivation does not provide any power to the completion tool. In certain embodiments, the current drawn during passivation may be converted into heat (e.g., by heating a resistor, varistor, or a diode), or used to charge a capacitor or other electronic device. In certain embodiments, depassivation is performed within a specified maximum time before use of the completion tool. For example, in certain embodiments, depassivation is performed within 24 hours prior to the use of a battery-powered completion tool. In other embodiments, depassivation is performed within 1 hour prior to the use of a battery-powered completion tool.

Depassivation may be performed automatically (e.g., on a schedule), in response to wireless signal, or in response to a measurement of battery performance. FIG. 1 depicts a process flow 10 for periodically depassivating a completion tool battery. The completion tool battery may be positioned within a completion tool disposed downhole or within a wellbore. FIG. 1 is not meant to require any particular order in which the methods of the present disclosure must be performed, and any order of performing these steps is contemplated by the present disclosure and claims. In certain embodiments, the process flow 10 may comprise running a completion with a battery-powered completion tool 11, waiting a period of time 12, and depassivating the battery 13. For example, in certain embodiments, the waiting period 12 may be hours, days, weeks, months, years, or another time interval. In certain embodiments, the length of the waiting period may depend on parameters such as the battery chemistry, the bottomhole temperature, the type of completion tool, the acceptable level of battery resistance, any other suitable parameters or any combination thereof.

In some embodiments, a controller coupled to the completion tool battery may comprise a memory with instructions to periodically depassivate the completion tool battery 13 as depicted in FIG. 1, or any combination thereof. In certain embodiments, process flow 10 may depassivate the completion tool battery periodically on a predetermined schedule. In some embodiments, the periodicity may be changed over time. For example, in some embodiments, the periodicity may be altered or adjusted based, at least in part, on changes in temperature or battery resistance over time. In some embodiments, process flow 10 may depassivate the completion tool battery based on an alarm, criteria, interrupt, semaphore, other suitable timing basis, any other indicator, or any combination thereof.

In certain embodiments, a completion tool may receive a wireless command 14 to operate. The wireless command 14 may be transmitted from an information handling system, downhole controller, another completion tool, or other source. If the completion tool receives a wireless command 14, it may carry out the commanded operation 15, drawing the necessary charge from the completion tool battery. In some embodiments, for example, the completion tool may be a flow controller and the wireless command 14 may instruct the completion tool to adjust flow restriction.

In certain embodiments, if the completion tool does not receive a wireless command 14, the completion tool and the completion tool battery are dormant until the waiting period 12 elapses and the completion tool battery is again depassivated 13. A wireless signal 14 with instructions to operate the completion tool 15 may interrupt the waiting period 12. In some embodiments, the waiting period 12 restarts after the completion tool completes the operation 15. In certain embodiments, a wireless command 14 may alter the duration of the waiting period 12 or the depassivation 13. In one or more embodiments, the duration of the waiting period 12 is predetermined. In some embodiments, the duration of the waiting period 12 is determined, based at least in part, on the battery chemistry, the bottomhole temperature, the type of completion tool, the acceptable level of battery resistance, any other suitable parameters or any combination thereof.

Figure 2:
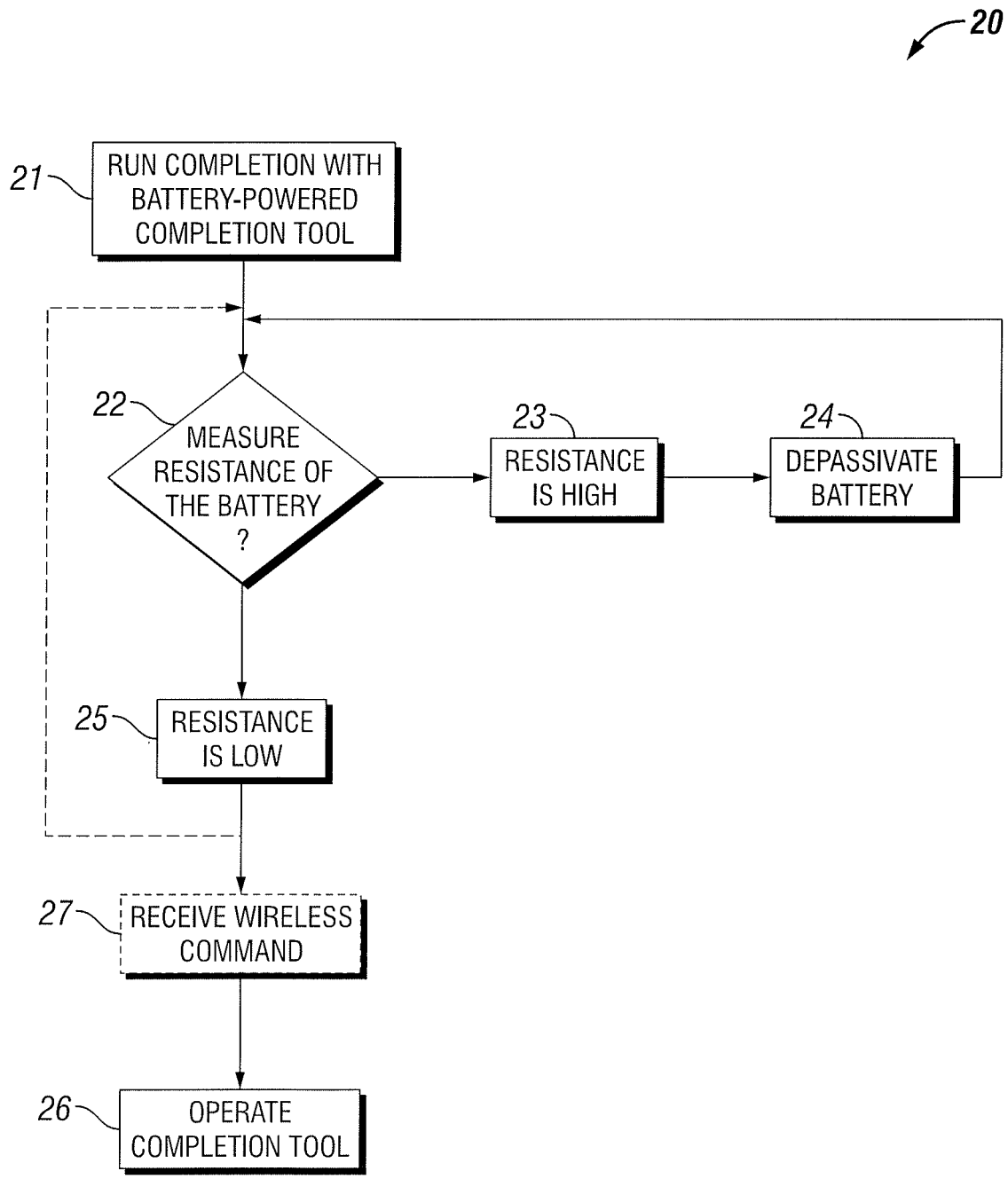
FIG. 2 is a process flow diagram for depassivating a completion tool battery in response to a measurement in accordance with certain embodiments of the present disclosure.

FIG. 2 depicts a process flow 20 for depassivating a completion tool battery in response to a measurement of battery performance. In certain embodiments, the process flow 20 may comprise running a completion with a battery-powered completion tool 21. Battery performance may be measured by battery resistance or battery voltage. In certain embodiments, battery resistance may be measured 22 to determine whether depassivation is necessary. Battery resistance and/or battery voltage may be measured by battery performance circuitry. For example, in certain embodiments, battery performance may be measured by drawing a specified current from the battery into a control circuit and measuring the voltage presented by the battery. Battery resistance may also be measured, for example, by placing a specified resistance on the completion tool battery and comparing the open circuit and the closed circuit voltage of the completion tool battery. The battery resistance may be measured as a steady-state condition or as a dynamic time varying condition. Dynamic resistance measurements may be pulsed measurements and may be indicative of the rate of recovery during the voltage delay. In certain embodiments, the completion tool battery is depassivated if the measurement of battery performance is indicative of passivation. In certain embodiments, if the battery voltage is below a certain threshold voltage, the battery resistance is considered high. In some embodiments, the threshold voltage may be determined based on one or more properties of the completion tool battery, such as the number of cells and the battery chemistry. In some embodiments, for example, the threshold voltage may be 26 Volts (V) for an eight cell moderate rate Li-thionyl chloride battery pack.

If battery resistance is high (e.g., the battery voltage is below the threshold voltage) 23, the battery may require depassivation 24. After depassivation 24, battery resistance may be measured again to determine whether the completion tool battery was sufficiently depassivated. If battery resistance is low (e.g., the battery voltage is above the threshold voltage) 25, the completion tool battery may not require depassivation. In certain embodiments, if the completion tool battery is not depassivated, the completion tool battery and completion tool may be dormant until battery resistance is measured again 22 or the completion tool is operated 26.

In certain embodiments, battery resistance may be measured periodically 22. For example, in some embodiments, a controller coupled to the completion tool battery or the completion tool may comprise a memory with instructions to regularly measure battery resistance. In some embodiments, battery resistance may be measured at any suitable time interval, for example, a daily, weekly, bi-weekly, or bi-monthly basis, on demand, or based on any other alarm, criteria, interrupt, or timing basis. In certain embodiments, the periodicity of the measurements may be based, at least in part, on any one or more parameters such as the battery chemistry, the bottomhole temperature, the acceptable level of battery resistance, the type of completion tool, the completion operations, or any combination thereof. In some embodiments, the periodicity may be changed, altered, or adjusted over time. For example, the periodicity may be altered based, at least in part, on changes in downhole conditions or battery performance.

In certain embodiments, the completion tool may receive a wireless command to perform an operation 26. In some embodiments, this may interrupt the periodic measurement of battery resistance 22. In some embodiments, battery resistance may be measured prior to each operation of the completion tool. In certain embodiments, battery resistance may be measured 24 hours prior to use or operation of the completion tool. In some embodiments, the periodic measurement of battery resistance 22 may resume after the completion tool is operated 26. In certain embodiments, the wireless command may alter the periodicity of the battery resistance measurement 22 or other parts of the process 20.

Completion tools may comprise a wide variety of components. For example, completion tools may include, without limitation, packers, screens, flow control devices, slotted tubing, sleeves, baffles, seats, valves, sensors, and actuators. In certain embodiments, the completion tool may comprise a flow control device, for example, a device capable of adjusting the fluid flow between a production string and a subterranean formation. In some embodiments, a flow control device may comprise a fracture sleeve, an inflow control device (ICD), an inflow control valve, or any combination thereof.

In some embodiments, the flow controller may be an electronic inflow control device. Inflow control devices may comprise equipment for controlling the rate of fluid flow from a well. In certain embodiments, an inflow control device may be used to balance inflow throughout the length of a tubing string of a well system by balancing or equalizing pressure from a wellbore of horizontal well. For example, in some embodiments, several inflow control devices disposed at different points along a tubing string of a well may be used to regulate the pressure at different locations in the tubing string. An inflow control device can also be used to stimulate production of fluid from a well. For example, an inflow control device can be used to inject fluid into the wellbore to stimulate the flow of production fluids, such as petroleum oil hydrocarbons, from a subterranean formation.

In certain embodiments, the completion tool is self-powered. For example, in some embodiments, the completion tool may not be coupled to an external power source on the surface or in another portion of the wellbore. In some embodiments, the completion tool battery may be the only power source for the completion tool and if the completion tool battery is passivated, the completion tool may be unable to function. For example, in some embodiments, a flow controller may be unable to adjust the flow of fluids between a production string and the subterranean formation if the battery powering the flow controller is significantly passivated.

Figure 3:
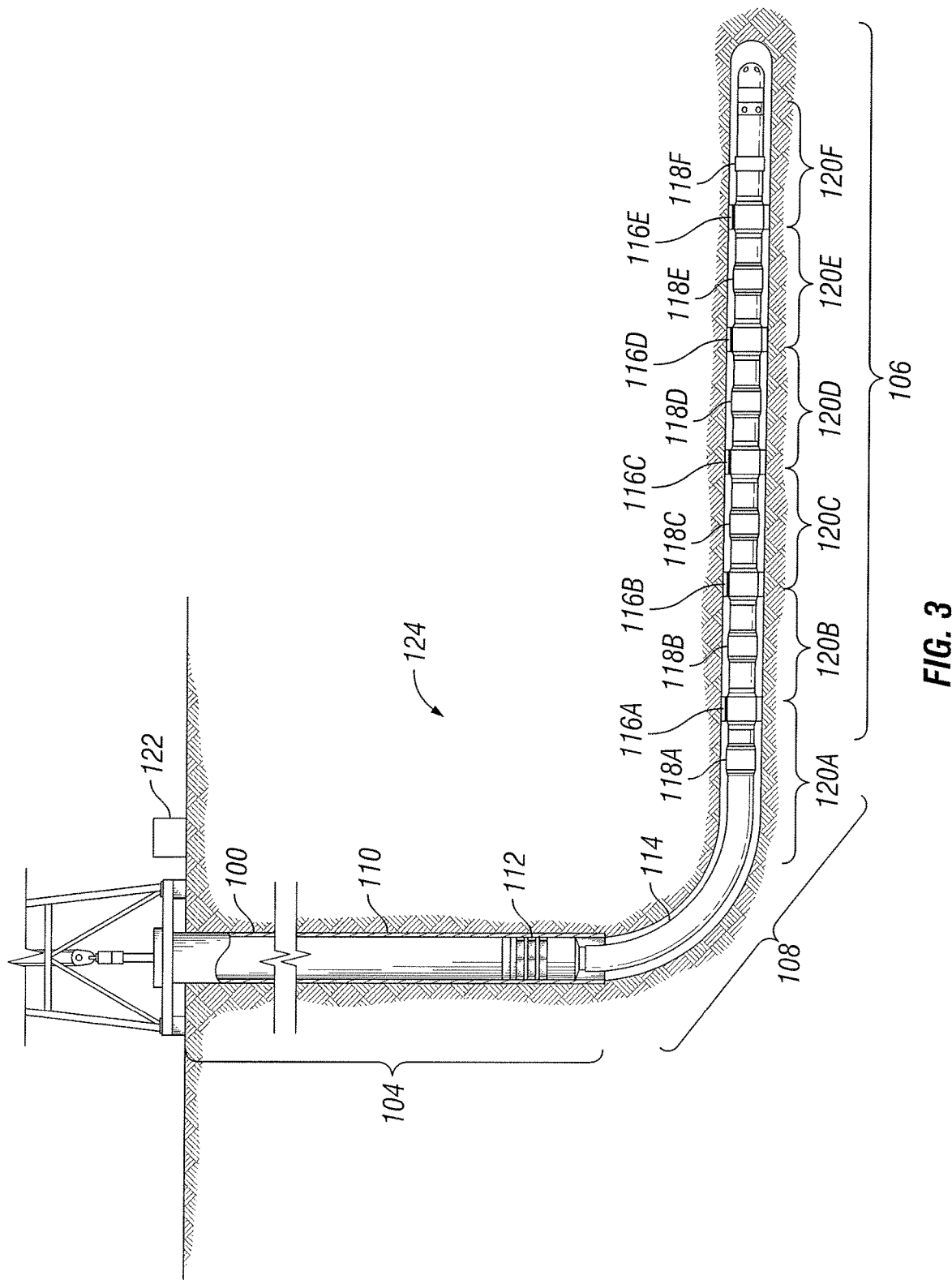
FIG. 3 is a schematic of a well system following a multiple-zone completion operation according to certain embodiments of the present disclosure.

FIG. 3 is a schematic of a well system following a multiple-zone completion operation. A wellbore 100 extends from a surface and through subsurface formations 124. The wellbore 100 has a substantially vertical section 104 and a substantially horizontal section 106, the vertical section 104 and horizontal section 106 being connected by a bend 108. The horizontal section 106 extends through a hydrocarbon bearing formation 124. One or more casing strings 110 are inserted and cemented into the vertical section 104 to prevent formation 124 fluids from entering the wellbore 100. Although the wellbore 100 shown in FIG. 3 has both a horizontal section 106 and a vertical section 104, the wellbore 100 may be substantially vertical (e.g., substantially perpendicular to the surface), substantially horizontal (e.g., substantially parallel to the surface), or may comprise a combination of horizontal and vertical sections.

The well system depicted in FIG. 3 is generally known as an open hole well because the casing strings 110 do not extend through the bend 108 and horizontal section 106 of the wellbore 100. As a result, the bend 108 and horizontal section 106 of the wellbore 100 are "open" to the formation 124. In another embodiment, the well system may be a closed hole type in which one or more casing strings 110 are inserted in the bend 108 and the horizontal section 106 and cemented in place. In some embodiments, the wellbore 100 may be partially completed (e.g., partially cased or cemented) and partially uncompleted (e.g., uncased and/or uncemented). Casing strings 110 may provide radial support to the wellbore 100 and may seal against unwanted communication of fluids between the wellbore 100 and the surrounding formation 124. In closed hole applications, all or some portions of the casing strings 110 may be perforated adjacent one or more production zones to extract fluids from the formation 124 into the wellbore 100.

The embodiment in FIG. 3 includes a top production packer 112 disposed in the vertical section 104 of the wellbore 100 that seals against the innermost casing string of casing strings 110. Production tubing 114 extends from the production packer 112, along the bend 108 and extends along the horizontal section 106 of the wellbore 100. Production tubing 114 is used to convey fluids including hydrocarbons, such as oil and gas, and other natural resources, such as water, from the formation 124 via the wellbore 100. The production tubing 114 may also be used to inject hydrocarbons and other natural resources into the formation 124 via the wellbore 100. The production tubing 114 may include multiple sections that are coupled or joined together by any suitable mechanism to allow the production tubing 114 to extend to a desired depth in the wellbore 100.

Disposed along the production tubing 114 are completions tools 116A-E and 118A-F. In the embodiment shown in FIG. 3, the completion tools are packers 116A-E and various flow control devices 118A-F. However, completion tools may also include, without limitation, screens, slotted tubing, sleeves, baffles, seats, valves, sensors, and actuators. Each of the flow control devices 118A-F and/or packers 116A-E may be self-powered and may comprise a lithium battery. The flow control devices 118A-F and/or packers 116A-E may also comprise an apparatus for depassivating a battery, circuitry for measuring battery resistance, or any combination thereof. The packers 116A-E engage the inner surface of the horizontal section 106, dividing the horizontal section 106 into a series of production zones 120A-F. Although FIG. 3 shows a production string comprising packers 116A-E and flow control devices 118A-F, the production tubing 114 may comprise additional completion tools to perform operations relating to completion of the wellbore 100, production of hydrocarbons and other natural resources from the formation 124 and production zones via the wellbore 100, injection of hydrocarbons and other natural resources into the formation 124 and production zones 120A-F via the wellbore 100, and/or maintenance of the wellbore 100. In certain embodiments, the production tubing 114 may comprise screens, additional flow control devices, slotted tubing, valves, sensors, actuators, and other completion tools.

The number and types of completion tools may depend on the type of wellbore and/or formation, the operations being performed in the wellbore, and anticipated wellbore conditions. In some embodiments, a well system may comprise a plurality of completion tools coupled to a production string.

In certain embodiments, each of the plurality of completion tools may comprise a battery. In some embodiments, each of the plurality of completion tools may comprise a controller configured to depassivate the battery by drawing current from the battery. In some embodiments, a well system may comprise any suitable number of completion tools, including, but not limited to 1, 2, 10, 35, 50, 100, or greater than 100 completion tools. In some embodiments, at least one of the controllers of the plurality of completion tools is configured to draw current from the completion tool battery in response to at least one of a signal or a measurement of battery performance.

Each flow control device 118A-F is generally operable between an open position and a closed position such that in the open position, they allow communication of fluid between the production tubing 114 and the production zones 120A-F. During production, fluid communication is generally from the formation 124, through the open flow control devices 118A-F, and into the production tubing 114. The packers 116A-F and the top production packer 112 seal the wellbore 100 such that any fluid that enters the wellbore 100 below the production packer 112 is directed through the flow control devices 118A-F, the production tubing 114, and the top production packer 112 and into the vertical section 104 of the wellbore 100.

Communication of fluid may also be from the production tubing 114, through the flow control devices 118A-F and into the formation 124, as is the case during hydraulic fracturing. Hydraulic fracturing is a method of stimulating production of a well and generally involves pumping specialized fracturing fluids down the well and into the formation 124. As fluid pressure is increased, the fracturing fluid creates cracks and fractures in the formation 124 and causes them to propagate through the formation 124. As a result, the fracturing creates additional communication paths between the wellbore and the formation 124.

In wells having multiple zones, such as the well depicted in FIG. 3, it is often necessary to fracture each zone individually. To fracture only one zone, the zone is isolated from other zones and fracturing fluid is prevented from entering the other zones. Isolating the zone being fractured may require actuating one or more downhole tools between different configurations, positions, or modes. For example, isolating the zone may require a sliding sleeve tool to move between a closed configuration and an open configuration, a packer may need to engage or disengage the wellbore, or a control valve may need to change its configuration to redirect the fracturing fluid. In certain embodiments, the flow control devices 118A-F may comprise sliding sleeves. Each of the sleeves may be independently operated to increase or decrease flow resistance into or out of a respective production zone 120A-F. For example, each of the sleeves may operate in response to a wireless signal or in response to the detection of a ball, tool, or fluid passing through the interior of the tubing.

In certain embodiments, the flow control devices 118A-F may regulate the flow of fluids into or out of production tubing 114 to provide improved well operations. For example, fluid flow may be regulated to maintain a flow rate that minimizes or eliminates water coning or gas coning in the formation 124. Fluid flow regulation may also be used to balance production rates of desired fluids from a formation 124 with one or multiple production zones, balance flow rates for injections of desired fluids into the formation 124 and particular production zones, minimize production from or injection into the formation 124 of undesired fluids, or any combination thereof.

Fluids may be extracted from or injected into the wellbore 100 and production zones 120A-F via flow control devices 118A-F and production tubing 114. For example, production fluids, including hydrocarbons, water, sediment, and other materials or substances found in the formation 124 may flow from the formation 124 and production zones 120A-F into the wellbore 100 through the sidewalls of open hole portions of the wellbore 100 or perforations in cased portions of the wellbore 100. The production fluids may circulate in the wellbore 100 before being extracted from the wellbore 100 via flow control devices 118A-F and production tubing 114. The production tubing 114 and/or flow control devices 118A-F may comprise screens to filter sediment from fluids flowing into the wellbore 100. The flow resistance provided by the flow control devices 118A-F may be adjustable in order to increase or decrease the rate of fluid flow through the flow control devices 118A-F.

The flow control devices 118A-F may be in communication with a control unit 122 that is remote from the flow control devices 118A-F and that transmits commands to the flow control devices 118A-F to increase or decrease the flow resistance provided by the flow control devices 118A-F. Although the control unit 122 is depicted on the surface in FIG. 3, the control unit 122 may be located at the well site, within the wellbore 100 at a location different from the location of flow control devices 118A-F, or within a lateral wellbore. The control unit 122 may include an information handling system or any other device that contains at least one processor communicably coupled to a non-transitory computer readable memory device containing a set of instructions that when executed by the at least one processor, cause the at least one processor to perform certain actions. Example processors include, but are not limited to, microprocessors, microcontrollers, digital signal processors (DSP), application specific integrated circuits (ASIC), or any other digital or analog circuitry configured to interpret and/or execute program instructions and/or process data. In certain embodiments, the control unit 122 may comprise a plurality of information handling systems arranged in a serial or parallel architecture to receive and process downhole measurement data. The control unit 122 may receive signals from the flow control devices 118A-F and/or transmit commands to the flow control devices 118A-F.

Figure 4:
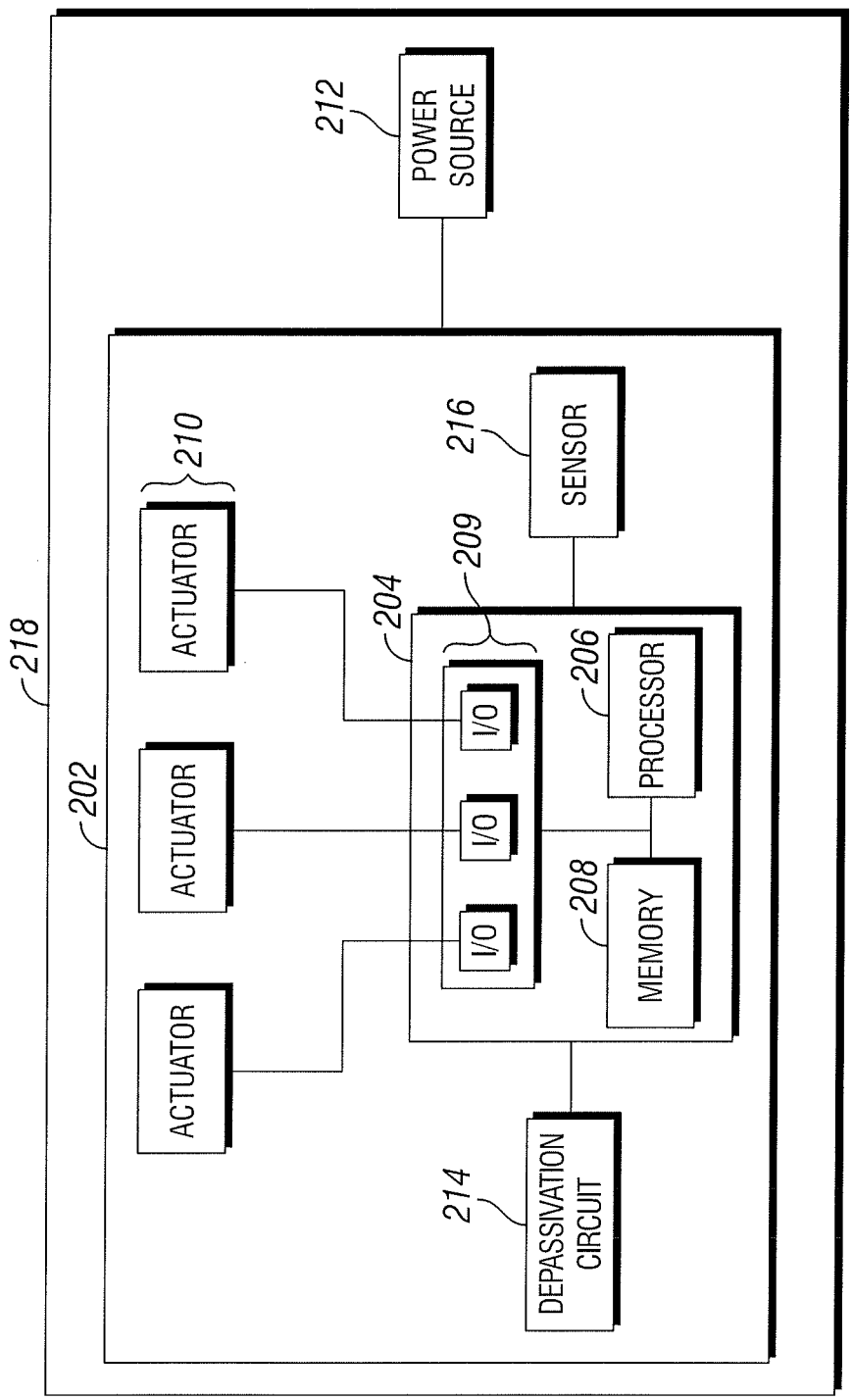
FIG. 4 is a block diagram depicting an embodiment of onboard electronics, actuators and other electronic components of a completion tool according to certain embodiments of the present disclosure.

In general, a completion tool may include onboard electronics to facilitate operation of the completion tool. FIG. 4 is a block diagram depicting a configuration of onboard electronics, actuators and other electronic components of a completion tool 218. The onboard electronics 202 may include a controller 204 for storing and executing instructions. In general, the controller 204 includes a processor 206 for executing instructions and a memory 208 for storing instructions to be executed by the processor 206 and may further include one or more input/output (I/O) modules 209 for communication between the controller 204 and other electronic components of the completion tool 218.

In certain embodiments, the controller 204 communicates with one or more actuators 210 to operate the completion tool between configurations, positions, or modes. In one embodiment, the actuators 210 convert electrical energy from a battery 212 to move one or more completion tool components. For example, one actuator may be a linear actuator that retracts or extends a pin for permitting or restricting movement of a completion tool 218 component. Another actuator may rotate a valve body to redirect a fluid flow through the completion tool 218.

The onboard electronics 202 and actuators 210 may be connected to a battery 212, such as a completion tool battery.

In some embodiments, the battery 212 may be a lithium battery integrated with the completion tool 218 or integrated with another completion tool electrically connected to the completion tool 218. The completion tool 218 may include at least one sensor 216 for detecting an incoming signal. In some embodiments, the incoming signal may be indicative of a physical property such as temperature, flow rate, magnetic field, electromagnetic radiation, pressure, or any combination thereof. The sensor 216 communicates the incoming signal to the onboard electronics 202. After receiving the incoming signal, the controller 204 may execute instructions based on the incoming signal. One or more of the instructions executed by the controller 204 may include sending control signals to one or more of the actuators 210, causing the actuators to actuate.

The onboard electronics 202 may comprise a depassivation circuit 214. The depassivation circuit 214 may comprise an apparatus for depassivating the battery 212, circuitry for measuring battery resistance to determine whether depassivation is needed, or any combination thereof. In certain embodiments, the controller 204 may send one or more control signals to the depassivation circuit 214, causing the depassivation circuit to draw current from the battery 212 or measure the resistance of the battery 212 to determine whether depassivation is needed. In some embodiments, the sensor 216 may receive an incoming signal causing the controller 214 to execute instructions including sending control signals to the depassivation circuit 214 to depassivate the battery 212.

According to aspects of the present disclosure, an example method comprises: providing a completion tool disposed within a wellbore penetrating at least a portion of a subterranean formation, wherein the completion tool is electrically coupled to an at least partially passivated lithium battery; depassivating the at least partially passivated lithium battery in the wellbore by discharging the lithium battery; and powering the completion tool with the at least partially depassivated lithium battery.

In one or more embodiments described in the preceding paragraph, the depassivating occurs in response to a signal received by the completion tool.

In one or more embodiments described in the preceding two paragraphs, the method further comprises measuring battery performance and depassivating the at least partially passivated lithium battery if the battery performance measurement is indicative of passivation.

In one or more embodiments, the depassivating occurs automatically according to a predetermined schedule.

In one or more embodiments described in the preceding four paragraphs, the depassivating comprises discharging the at least partially passivated lithium battery to at least one of a resistor, a varistor, or a diode.

In one or more embodiments described in the preceding five paragraphs, the discharging does not provide any power to the completion tool.

In one or more embodiments described in the preceding six paragraphs, the completion tool is a flow control device.

In one or more embodiments described in the preceding paragraph, the completion tool is an electronic inflow control device.

In one or more embodiments described in the preceding eight paragraphs, the depassivating comprises drawing a constant current from the at least partially passivated lithium battery for a period of time.

In one or more embodiments described in the preceding nine paragraphs, the at least partially passivated lithium battery comprises a lithium thionyl chloride cell.

In one or more embodiments described in the preceding ten paragraphs, the at least partially passivated lithium battery comprises a lithium secondary cell.

According to aspects of the present disclosure, an example system comprises: a production string disposed in a wellbore penetrating at least a portion of a subterranean formation; and a completion tool coupled to the production string, wherein the completion tool comprises a lithium battery and a controller configured to depassivate the lithium battery by drawing current from the lithium battery.

In one or more embodiments described in the preceding paragraph, the controller is configured to draw current from the lithium battery in response to at least one of a signal or a measurement of battery performance.

In one or more embodiments, the controller is configured to automatically depassivate the lithium battery.

In one or more embodiments described in the preceding three paragraphs, the current drawn from the lithium battery flows to a control circuit comprising at least one of a resistor, varistor, or diode.

In one or more embodiments described in the preceding four paragraphs, the completion tool is not coupled to an external power source other than the lithium battery.

In one or more embodiments described in the preceding five paragraphs, the completion tool further comprises circuitry for measuring battery resistance.

According to aspects of the present disclosure, an example system comprises: a production string disposed in a wellbore penetrating at least a portion of a subterranean formation; and a plurality of completion tools coupled to the production string, wherein each of the plurality of completion tools comprises a lithium battery and a controller configured to depassivate the battery by drawing current from the lithium battery.

In one or more embodiments described in the preceding paragraph, at least one of the controllers is configured to draw current from at least one of the lithium batteries in response to at least one of a signal or a measurement of battery performance.

In one or more embodiments described in the preceding two paragraphs, at least one of the controllers is configured to automatically depassivate at least one of the lithium batteries.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. While numerous changes may be made by those skilled in the art, such changes are encompassed within the spirit of the subject matter defined by the appended claims. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. In particular, every range of values (e.g., "from about a to about b," or, equivalently, "from approximately a to b," or, equivalently, "from approximately a-b") disclosed herein is to be understood as referring to the power set (the set of all subsets) of the respective range of values. The terms in the claims have their plain, ordinary meaning unless otherwise explicitly and clearly defined by the patentee.

What is claimed is:

1. A method comprising:
   providing a completion tool disposed within a wellbore penetrating at least a portion of a subterranean formation, wherein the completion tool is electrically coupled to an at least partially passivated lithium battery;
   depassivating the at least partially passivated lithium battery in the wellbore by discharging the lithium battery, wherein the depassivating comprises:
   measuring a resistance of the battery; and
   depassivating the battery based on the measured resistance of the battery; and
   powering the completion tool with the at least partially depassivated lithium battery.

2. The method of claim 1, wherein the depassivating occurs in response to a signal received by the completion tool.

3. The method of claim 1, further comprising measuring battery performance and depassivating the at least partially passivated lithium battery if the battery performance measurement is indicative of passivation.

4. The method of claim 1, wherein the depassivating comprises discharging the at least partially passivated lithium battery to at least one of a resistor, a varistor, or a diode.

5. The method of claim 1, wherein the discharging does not provide any power to the completion tool.

6. The method of claim 1, wherein the completion tool is a flow control device.

7. The method of claim 6, wherein the completion tool is an electronic inflow control device.

8. The method of claim 1, wherein the depassivating comprises drawing a constant current from the at least partially passivated lithium battery for a period of time.

9. The method of claim 1, wherein the at least partially passivated lithium battery comprises a lithium thionyl chloride cell.

10. The method of claim 1, wherein the at least partially passivated lithium battery comprises a lithium secondary cell.

11. The method of claim 1, wherein the completion tool comprises a flow control device configured to control flow of fluid into and from specific production zones.

12. A system comprising:
    a production string disposed in a wellbore penetrating at least a portion of a subterranean formation; and
    a completion tool coupled to the production string, wherein the completion tool comprises a lithium battery and a controller configured to depassivate the lithium battery by drawing current from the lithium battery, wherein the depassivating comprises:
    measuring a resistance of the battery; and
    depassivating the battery based on the measured resistance of the battery.

13. The system of claim 12, wherein the controller is configured to draw current from the lithium battery in response to at least one of a signal or a measurement of battery performance.

14. The system of claim 12, wherein the current drawn from the lithium battery flows to a control circuit comprising at least one of a resistor, varistor, or diode.

15. The system of claim 12, wherein the completion tool is not coupled to an external power source other than the lithium battery.

16. The system of claim 12, wherein the completion tool further comprises circuitry for measuring battery resistance.

17. The system of claim 12, wherein the completion tool comprises a flow control device configured to control flow of fluid into and from specific production zones.

18. A system comprising:
    a production string disposed in a wellbore penetrating at least a portion of a subterranean formation; and
    a plurality of completion tools coupled to the production string, wherein each of the plurality of completion tools comprises a lithium battery and a controller configured to depassivate the battery by drawing current from the lithium battery, wherein the depassivating comprises measuring a resistance of the battery and depassivating the battery based on the measured resistance of the battery.

19. The system of claim 18, wherein at least one of the controllers is configured to draw current from at least one of the lithium batteries in response to at least one of a signal or a measurement of battery performance.

* * * * *